United States Patent [19]
Nakatani

[11] Patent Number: 6,140,749
[45] Date of Patent: Oct. 31, 2000

[54] MONOLITHIC PIEZOELECTRIC BODY AND PIEZOELECTRIC ACTUATOR

[75] Inventor: Hiroshi Nakatani, Omihachiman, Japan

[73] Assignee: Murata Manufacturing Co, Ltd, Japan

[21] Appl. No.: 09/310,599

[22] Filed: May 12, 1999

[30] Foreign Application Priority Data

May 21, 1998 [JP] Japan .................................. 10-140115

[51] Int. Cl.[7] .................................................. H01L 41/083
[52] U.S. Cl. .......................................... 310/366; 310/334
[58] Field of Search .................................. 310/322, 334, 310/366

[56] References Cited

U.S. PATENT DOCUMENTS 6,008,565 12/1999 Inoi et al. ................................ 310/366

*Primary Examiner*—Thomas M. Dougherty
*Attorney, Agent, or Firm*—Keating & Bennett LLP

[57] ABSTRACT

A monolithic piezoelectric body includes first internal electrodes which extend to a first side surface of the piezoelectric body but do not extend to a second side surface of the piezoelectric body, and second internal electrodes which extend to the second side surface but do not extend to the first side surface. A connecting internal electrode is disposed within the piezoelectric body and extends between the first and second side surfaces. A first external electrode is disposed on the first side surface and is electrically connected to the first internal electrodes. A second external electrode is arranged on the first side surface so as to be separated from the first external electrode and electrically connected to the connecting internal electrode. A third external electrode is disposed on the second side surface so as to electrically connect the second internal electrodes and the connecting internal electrode.

20 Claims, 6 Drawing Sheets

MONOLITHIC PIEZOELECTRIC BODY AND PIEZOELECTRIC ACTUATOR

BACKGROUND OF THE INVENTION

1. Field of the Invention

The present invention relates to a monolithic piezoelectric body and a piezoelectric actuator, and more particularly, to a monolithic piezoelectric body and a piezoelectric actuator which may be used in a printing head of an ink jet printer.

2. Description of Related Art

Conventionally, a piezoelectric actuator has been used to drive a printing head of an ink jet printer. First, an example of a conventional piezoelectric actuator will be described with reference to FIGS. 6 through 8.

FIG. 6 is a perspective view of a conventional monolithic piezoelectric body used for producing a piezoelectric actuator. In FIG. 6, a monolithic piezoelectric actuator 51 having a rectangular parallelepiped shape is made of a sintered ceramic body 56 which is produced by firing a monolithic body including piezoelectric ceramic sheets and internal electrodes.

In order to produce the sintered ceramic body 56, as shown in FIGS. 7A and 7B, a ceramic green sheet 52 has an internal electrode 53 printed thereon, and a ceramic green sheet 54 has an internal electrode 55 printed thereon. Subsequently, a plurality of ceramic green sheets 52 and a plurality of ceramic green sheets 54 are alternately laminated to form a laminate body. The layers and components of the laminate body are pressed in the thickness direction thereof and fired, to thereby obtain the monolithic sintered ceramic body 56.

The internal electrodes 53 are exposed at a portion of a side surface 56a of the sintered ceramic body 56 as well as at side surfaces 56b and 56c of the sintered ceramic body 56. The internal electrodes 55 are exposed at a region isolated from the internal electrodes 53 on a side surface 56a of the sintered ceramic body 56, as well as, at side surfaces 56c and 56d of the sintered ceramic body 56.

External electrodes 57 and 58 are disposed on the side surface 56a of the sintered ceramic body 56. The external electrode 57 is isolated from the external electrode 58. The external electrode 57 is electrically connected to the internal electrodes 55, while the external electrode 58 is electrically connected to the internal electrodes 53.

During use, the monolithic piezoelectric body 51 is driven via application of AC voltage between the external electrodes 57 and 58.

In order to drive a printing head of an ink-jet printer, a plurality of actuator units must be formed from the above-described monolithic piezoelectric body 51.

A plurality of slits A are formed in an upper surface 56e of the monolithic piezoelectric body 51 such that the slits A extend from the side surface 56a to the side surface 56c, to thereby form a plurality of actuator units 60–63. The thus-formed conventional piezoelectric actuator 59 is illustrated in FIG. 8.

The slits A divide the external electrode 58 into a plurality of external electrodes 60a–63a, which are electrically connected to first internal electrodes of the piezoelectric actuator units 60–63, respectively.

However, second internal electrodes of the piezoelectric actuator units 60–63 are not electrically connected to the external electrode 57. That is, the internal electrodes 55 formed in the monolithic piezoelectric body 51 are divided by the slits A, so that electric connection between the second internal electrodes and the external electrode 57 is broken.

Therefore, the second internal electrodes formed by division of the internal electrode 55 shown in FIG. 7B must be connected to an electric power source on the side surfaces of the piezoelectric actuators 60–63 disposed opposite to the side surface 56a; i.e., the side surface 56c of the sintered ceramic 56. More specifically, external electrodes are disposed on the side surface 56c, and the external electrodes are connected to the power source. Thus, in the actuator 59, electric connection to an electric power source and other elements via conductors such as lead wires must be established on two side surfaces 56a and 56c.

Therefore, the conventional monolithic piezoelectric body and the piezoelectric actuator have several disadvantages including high production cost and insufficient reliability.

SUMMARY OF THE INVENTION

To overcome the above described problems, preferred embodiments of the present invention provide a monolithic piezoelectric body which facilitates electric connection between a plurality of piezoelectric actuator units and an electric power source and other elements on one side surface of the monolithic piezoelectric body so as to provide a piezoelectric actuator which is easily produced, has excellent reliability, and enables production of an inexpensive piezoelectric actuator.

One preferred embodiment of the present invention provides a monolithic piezoelectric body including a piezoelectric body having an upper surface, a lower surface, and first and second side surfaces opposite each other and disposed between the upper and lower surfaces, a plurality of internal electrodes layered in the thickness direction within the piezoelectric body with piezoelectric layers interposed therebetween, the plurality of internal electrodes including first internal electrodes which extend to the first side surface but do not extend to the second side surface, and second internal electrodes which extend to the second side surface but do not extend to the first side surface, a connecting internal electrode disposed within the piezoelectric body and extending to the first and second side surfaces, a first external electrode disposed on the first side surface of the piezoelectric body and electrically connected to the first internal electrodes, a second external electrode disposed on the first side surface of the piezoelectric body so as to be separated from the first external electrode and electrically connected to the connecting internal electrode, and a third external electrode disposed on the second side surface of the piezoelectric body so as to electrically connect the second internal electrodes and the connecting internal electrode.

In the above-described piezoelectric body, the first internal electrodes are electrically connected to the first external electrode disposed on the first side surface, while the second internal electrodes, which are exposed at the second side surface, are connected to the second external electrode disposed on the first side surface, via the third external electrode disposed on the second side surface and the connecting internal electrode. Thus, the piezoelectric body can be driven through application of AC voltage between the first and second external electrodes. Therefore, electric connection is achieved at a single surface, i.e. the first side surface.

The unique structure and arrangement of preferred embodiments described above greatly facilitates and simplifies electrical connection, such as connection of lead wires to the external electrode for driving purposes. This unique structure and arrangement also greatly improves reliability and reduces production costs.

Preferably, the piezoelectric body including the plurality of internal electrodes and the connecting internal electrode is formed of a sintered ceramic which is obtained by firing as a monolithic body, the internal electrodes, the connecting electrode, and a piezoelectric ceramic. In this case, the above-described piezoelectric body has a very small size and is easily produced via an electrode-ceramic monolithic firing technique.

Preferably, the piezoelectric body has a plurality of connecting internal electrodes which are disposed at respective vertical positions which are substantially equal to the locations or positions of the first or second internal electrodes. In this case, the connecting internal electrodes can be easily formed during the step of forming the first and second internal electrodes. When the piezoelectric body is formed via an electrode-ceramic monolithic firing technique, the connecting internal electrode and the first and second internal electrodes may be disposed on a common ceramic green sheet during a single step. Thus, the number of production steps is further reduced.

Another preferred embodiment of the present invention provides a piezoelectric actuator including a piezoelectric body having an upper surface, a lower surface, and first and second side surfaces opposite each other and disposed between the upper and lower surfaces, a plurality of internal electrodes layered in the thickness direction within the piezoelectric body with piezoelectric layers interposed therebetween, the plurality of internal electrodes including first internal electrodes which extend to the first side surface but do not extend to the second side surface, and second internal electrodes which extend to the second side surface but do not extend to the first side surface, a connecting internal electrode disposed within the piezoelectric body and extending between the first and second side surfaces, a plurality of slits disposed in the upper surface of the piezoelectric body such that the slits extend from the first side surface to the second side surface and are deep enough to penetrate a portion where the plurality of internal electrodes are layered, to thereby define a plurality of piezoelectric actuator units isolated by the slits, a plurality of first external electrodes each disposed on the first side surface to correspond to the corresponding piezoelectric actuator unit and electrically connected to the first internal electrodes of the corresponding piezoelectric actuator unit, a second external electrode disposed on the first side surface and electrically connected to the connecting internal electrode, and a third external electrode disposed on the second side surface so as to electrically connect the connecting internal electrode and the second internal electrodes of the piezoelectric actuator units.

In the above piezoelectric actuator, each of the piezoelectric actuator units can be driven by use of the second external electrode and the first external electrode disposed on the piezoelectric actuator unit.

Therefore, a plurality of piezoelectric actuator units can be driven through electrical connection with an electric power circuit provided only at the first side surface of the piezoelectric body. This unique structure and arrangement allows for greatly simplified electrical connection, enhanced reliability, and significantly reduced production costs.

Preferably, the third external electrode is disposed to extend to a region lower than the bottom ends of the slits and thus, has a continuous portion in this region. In this case, the second internal electrodes in the piezoelectric actuator units and the connecting electrode remain connected even after the slits are formed.

Preferably, the first external electrode is disposed at a position higher than the bottom ends of the slits. In this case, formation of the slits ensures that the first external electrodes of the piezoelectric actuator units are isolated from one another.

Other features and advantages of the present invention will become apparent from the following description of the invention which refers to the accompanying drawings.

DETAILED DESCRIPTION OF PREFERRED EMBODIMENTS

Figure 1:
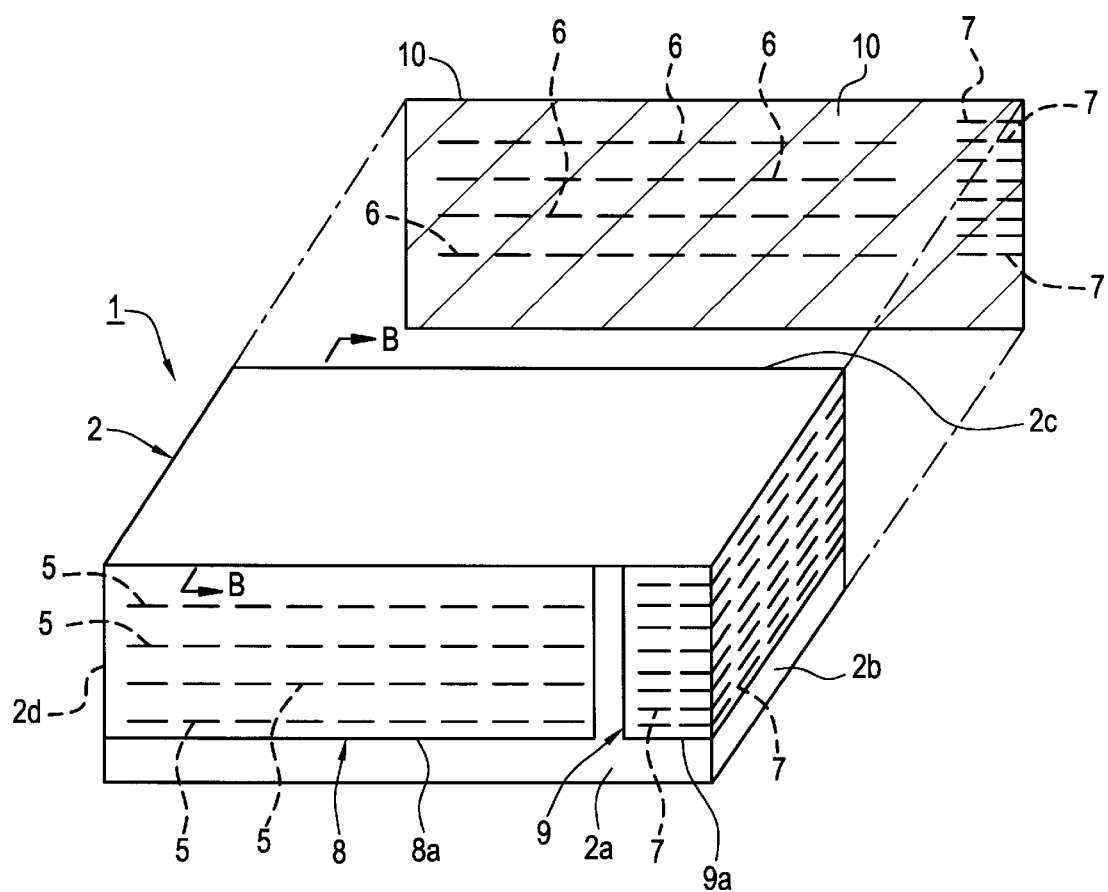
FIG. 1 is a perspective view of a monolithic piezoelectric body according to a first preferred embodiment of the present invention.

As shown in FIG. 1, a monolithic piezoelectric body 1 includes a sintered piezoelectric ceramic body 2 preferably having a substantially rectangular plate-like shape. In the sintered ceramic body 2, first and second internal electrodes described below and connecting internal electrodes are laminated and fired to define a monolithic body for providing the piezoelectric ceramic body 2. A method for producing the sintered ceramic body 2 will next be described with reference to FIG. 2.

Figure 2A:
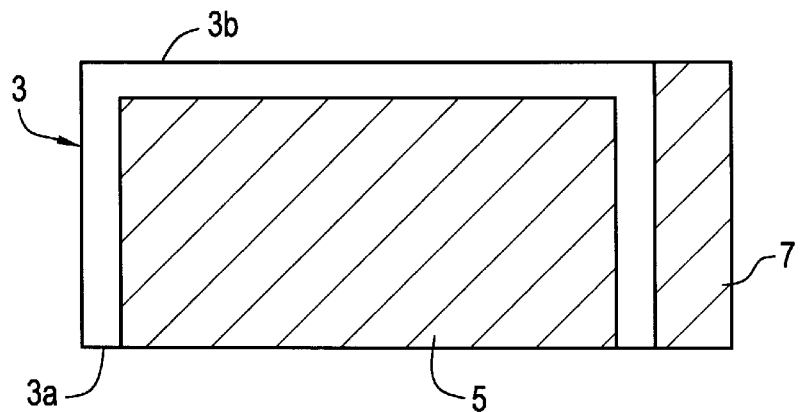
FIG. 2A is a plan view of a ceramic green sheet having a first internal electrode and a connecting internal electrode, the ceramic green sheet being used for production of the monolithic piezoelectric body shown in FIG. 1.
Figure 2B:
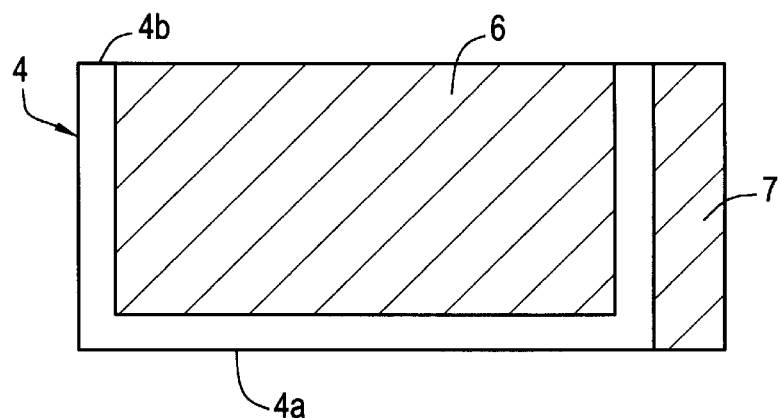
FIG. 2B is a plan view of a ceramic green sheet having a second internal electrode and a connecting internal electrode, the ceramic green sheet being used for production of the monolithic piezoelectric body shown in FIG. 1.

As shown in FIGS. 2A and 2B, substantially rectangular ceramic green sheets 3 and 4 preferably made primarily of piezoelectric ceramic are prepared. A piezoelectric ceramic such as lead titanate zirconate ceramic may be used as the ceramic material or other suitable materials may be used to form the green sheets 3.

On the ceramic green sheet 3, a first internal electrode 5 is formed by application of a conductive paste via screen printing or other suitable method such that the electrode extends to one side edge 3a of the ceramic green sheet 3. By the side of the first internal electrode 5, a connecting internal electrode 7 is formed by application of a conductive paste via screen printing or other suitable method such that the connecting electrode extends between a side edge 3a and the opposite side edge 3b.

On the ceramic green sheet 4, a second internal electrode 6 is formed via screen printing or other suitable method such that the electrode 6 extends to one side edge 4b of the ceramic green sheet 4 but does not extend to the other side edge 4a. By the side of the second internal electrode 6, a connecting internal electrode 7 is formed such that the connecting electrode 7 extends between the side edge 4a and the opposite side edge 4b.

The above-described ceramic green sheets 3 and 4 are alternately laminated to define a laminated body, which is pressed in the thickness direction thereof and fired to thereby obtain the sintered ceramic body 2 shown in FIG. 1.

Figure 3:
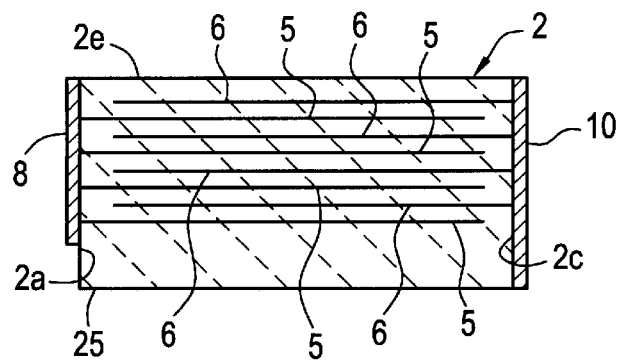
FIG. 3 is a cross-sectional view of the monolithic piezoelectric body taken along line B—B in FIG. 1.

As is clear from FIG. 3, which is a cross-sectional view taken along the line B—B in FIG. 1, the above-described first and second internal electrodes 5 and 6 are alternately laminated in the thickness direction of the sintered ceramic body 2 with ceramic layers being interposed therebetween. The first internal electrodes 5 are exposed at a first side surface 2a but are not exposed at side surfaces 2b, 2c, and 2d. In the description of preferred embodiments of the present invention, among the side surfaces 2b through 2d, the side surface 2c facing opposite to the first side surface 2a is considered the second side surface.

The second internal electrodes 6 are exposed at the second side surface 2c but are not exposed at the side surfaces 2a, 2b, and 2d.

The connecting internal electrodes 7 are exposed at the side surfaces 2a, 2b, and 2c of the sintered ceramic 2. The connecting internal electrodes 7 are formed so as to extend between the first and second side surfaces 2a and 2b of the sintered ceramic 2, which are disposed opposite each other.

First and second external electrodes 8 and 9 are provided on the first side surface 2a of the sintered ceramic 2. The first external electrode 8 is electrically connected to the first internal electrodes 5, and the second external electrode 9 is electrically connected to the connecting internal electrodes 7. The first external electrode 8 and the second external electrode 9 are isolated from each other on the side surface 2a.

The lower end 8a of the first external electrode 8 and the lower end 9a of the second external electrode 9 do not reach the lower end of the side surface 2a of the sintered ceramic 2 but are located between the upper and lower ends of the side surface 2a.

The side surface 2c is shown in a projection view in FIG. 1. As shown in the projection view, a third external electrode 10 is disposed on the side surface 2c of the sintered ceramic 2 so as to completely cover the side surface 2c. Thus, the third external electrode 10 is electrically connected to both the internal electrodes 6 and the connecting internal electrodes 7.

Therefore, the monolithic piezoelectric body 1 can be driven through application of AC voltage between the first and second external electrodes 8 and 9.

Since the internal electrodes 6 are electrically connected to the second external electrode 9 via the third external electrode 10 and the connecting internal electrodes 7, connection with an electric power source can be achieved at a single side surface; i.e., at the first side surface 2a of the sintered ceramic 2. The external electrodes 8–10 may be formed through an appropriate method such as vapor deposition, plating, or sputtering.

A piezoelectric actuator including the above-described monolithic piezoelectric body 1 will next be described with reference to FIG. 4.

Figure 4:
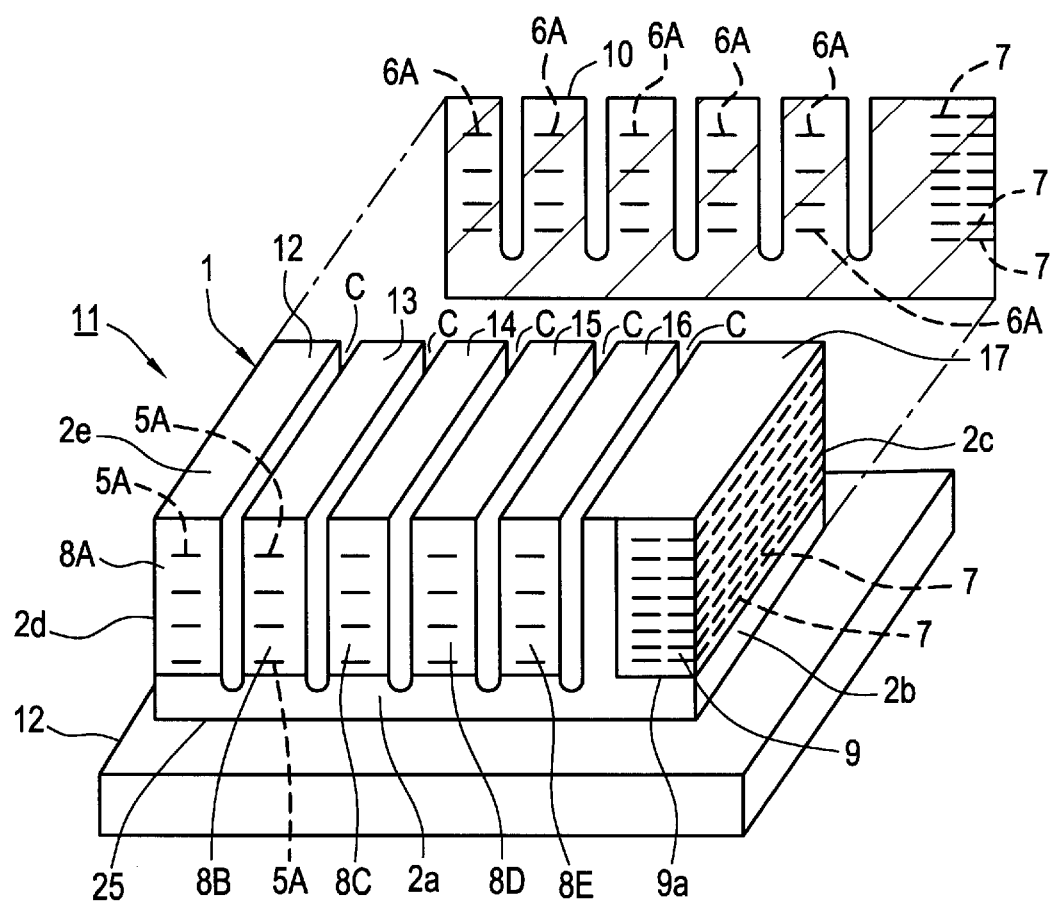
FIG. 4 is a perspective view describing a piezoelectric actuator according to a second preferred embodiment of the present invention.

FIG. 4 is a perspective view showing a piezoelectric actuator according to a second preferred embodiment of the present invention. In the piezoelectric actuator 11, the monolithic piezoelectric body 1 is fixed on a supporting substrate 12. No particular limitation is imposed on the method for fixation. For example, an adhesive may be used to fix the monolithic piezoelectric body 1 to the supporting substrate 12 or other joining methods or devices may be used.

After the monolithic piezoelectric body 1 is fixed on the supporting substrate 12, a plurality of slits C are formed in the upper surface 2e of the sintered ceramic 2. The slits C are formed so as to extend from the first side surface 2a to the second side surface 2c. The depth of the slits C is selected such that bottom ends of the slits C are located at a position lower than the lower ends 8a and 9a of the first and second external electrodes 8 and 9.

Thus, as shown in FIG. 4, a plurality of actuator units 12–16 and a connecting unit 17 are provided through formation of a plurality of slits C.

The first external electrode 8 is divided into a plurality of first external electrodes 8A–8E because of the formation of the slits C. Each of the external electrodes 8A–8E is electrically connected to first internal electrodes 5A of the corresponding piezoelectric actuator units 12–16.

The slits C are formed such that they do not reach the lower surface 2f of the sintered ceramic 2. Thus, as shown in the projection view of FIG. 4, the third external electrode 10 has a continuous portion at a location lower than the slits C in the second side surface 2c of the sintered ceramic 2.

Therefore, the third external electrode 10 establishes connection among the second internal electrodes 6A of the piezoelectric actuator units 12–16. In addition, the connecting internal electrodes 7 are electrically connected to the third external electrode 10.

Since the connecting electrodes 7 are disposed in the connecting unit 17, the second internal electrodes 6A of the piezoelectric actuator units 12–16 are electrically connected to the second external electrode 9 disposed on the front surface; i.e., the first side surface 2a, of the connecting unit 17.

Thus, in the piezoelectric actuator 11 according to preferred embodiments of the present embodiment, each of the piezoelectric actuator units 12–16 can be driven through application of voltage between the second external electrode 9 and the corresponding external electrode 8A–8E.

In this case, the external electrodes 8A–8E and the external electrode 9 are disposed on the first side surface 2a of the sintered ceramic 2. Therefore, when these electrodes are electrically connected to an electric power source via a lead wire and other conductors, connection of wires is required only at the side surface 2a. This greatly simplifies electric connection and reduces production costs.

Figure 5:
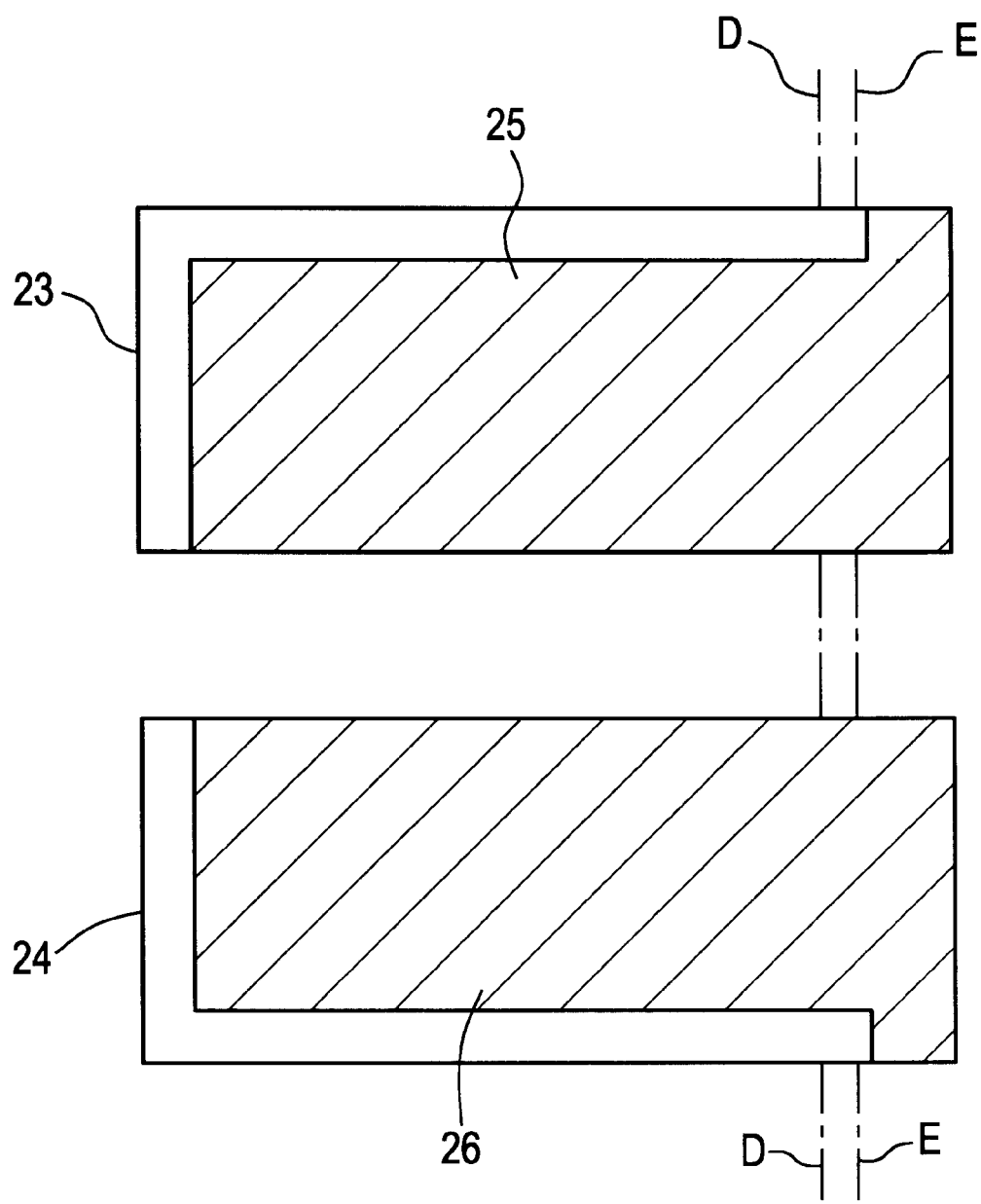
FIG. 5 is a plan view of ceramic green sheets each having an internal electrode, both green sheets used for production of a piezoelectric actuator according to a first preferred embodiment of the present invention.
Figure 6:
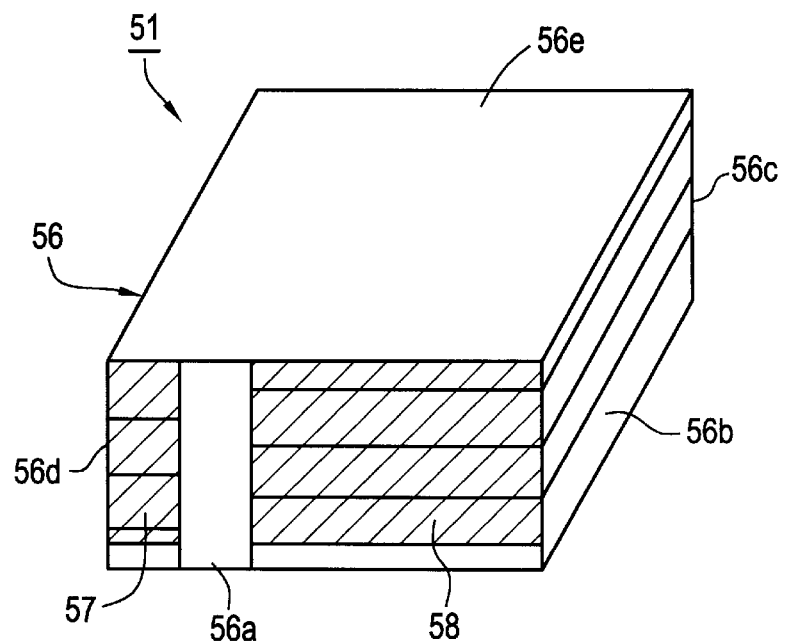
FIG. 6 is a perspective view of a conventional monolithic piezoelectric body.
Figure 7A:
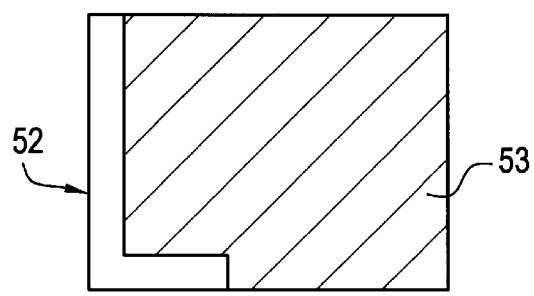
FIG. 7A is a plan view of a ceramic green sheets having an internal electrode, the ceramic green sheet being used for production of the conventional monolithic piezoelectric body shown in FIG. 6.
Figure 7B:
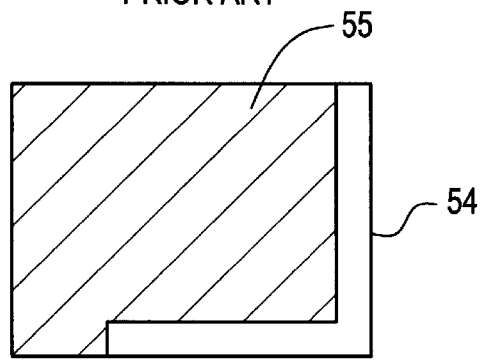
FIG. 7B is a plan view of another ceramic green sheet having an internal electrode, the ceramic green sheet being used for production of the conventional monolithic piezoelectric body shown in FIG. 6.
Figure 8:
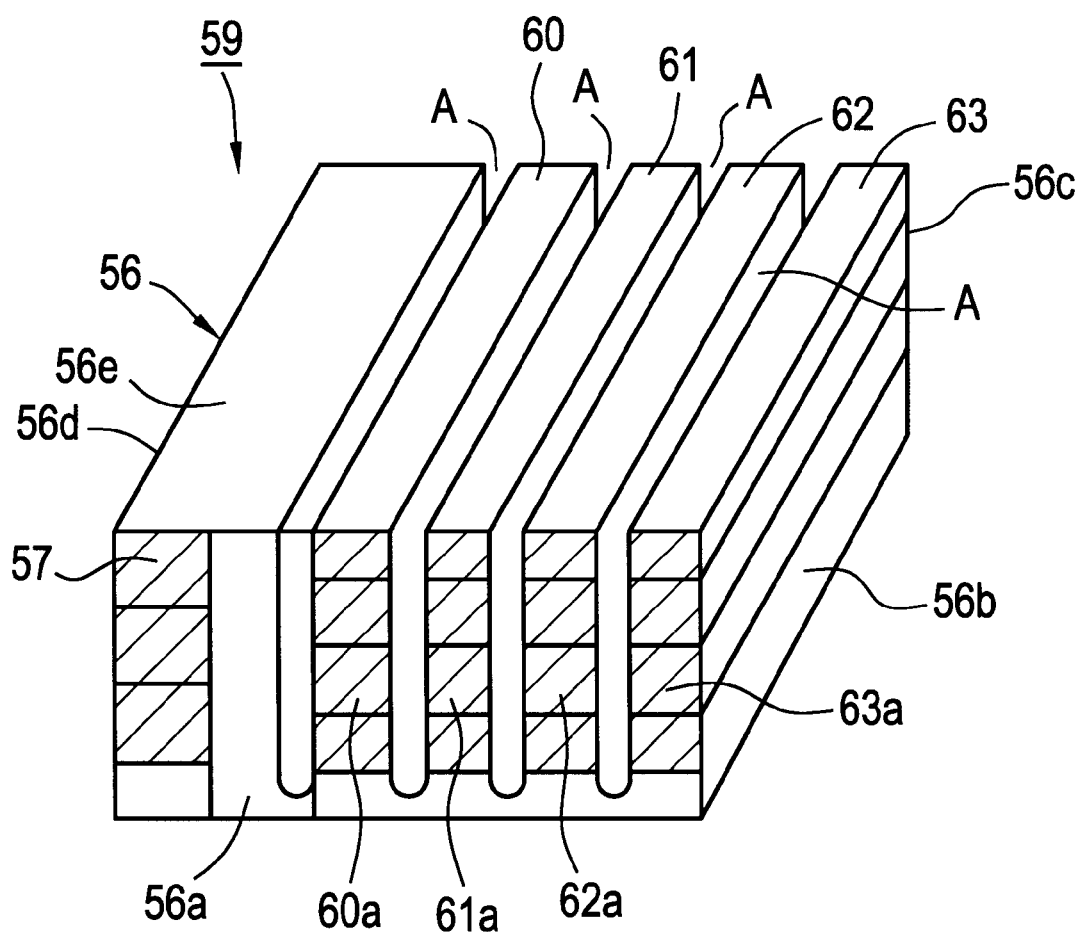
FIG. 8 is a perspective view of a conventional monolithic piezoelectric actuator formed from the monolithic piezoelectric body shown in FIG. 6.

In the above-described preferred embodiment, the connecting internal electrodes 7 and the first and second internal electrode 5 and 6 are individually disposed on the ceramic green sheets 3 and 4. However, as shown in FIG. 5, a single internal electrode 25 may be disposed on a ceramic green sheet 23, and a single internal electrode 26 may be disposed on a ceramic green sheet 24. The internal electrode 25 is equivalent to an electrode in which the first internal electrode 5 and the connecting internal electrode 7 shown in FIG. 2A are connected, while the internal electrode 26 is equivalent to an electrode in which the second internal electrode 6 and the connecting internal electrode 7 shown in FIG. 2B are connected.

The above-described ceramic green sheets 23 and 24 are laminated to thereby produce a laminated body, which is pressed in the thickness direction thereof and fired to thereby obtain a monolithic piezoelectric body. In the thus-obtained monolithic piezoelectric body, first or second electrodes and connecting internal electrodes are connected with each other. In order to divide the internal electrodes 25 and 26, a slit having a width equivalent to the distance between chain lines D and E shown in FIG. 5 is formed in the upper surface of the monolithic piezoelectric body to the same depth as that of the above-described slits C. Thus, the internal electrodes 25 and 26 can be divided so as to have the first and second internal electrodes 5 and 6 and the connecting electrode 7.

However, in the above-described method, polarization treatment cannot be performed before formation of slits, since the internal electrodes 25 and 26 are connected together. Thus, polarization treatment must be performed after formation of the slits.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric device comprising:
   a piezoelectric body having an upper surface, a lower surface, and first and second side surfaces opposite each other and disposed between the upper and lower surfaces;
   a plurality of internal electrodes layered in a thickness direction within the piezoelectric body;
   a plurality of piezoelectric layers interposed between the plurality of internal electrodes, the plurality of internal electrodes including first internal electrodes which extend to the first side surface but do not extend to the second side surface, and second internal electrodes which extend to the second side surface but do not extend to the first side surface;
   a connecting internal electrode disposed within the piezoelectric body and extending to the first and second side surfaces;
   a first external electrode disposed on the first side surface of the piezoelectric body and being electrically connected to the first internal electrodes;
   a second external electrode disposed on the first side surface of the piezoelectric body so as to be separated from the first external electrode and electrically connected to the connecting internal electrode; and
   a third external electrode disposed on the second side surface of the piezoelectric body so as to electrically connect the second internal electrodes and the connecting internal electrode.

2. The piezoelectric device according to claim 1, wherein the piezoelectric body including the plurality of internal electrodes and the connecting internal electrode is a monolithic sintered ceramic body.

3. The piezoelectric device according to claim 2, wherein the monolithic sintered ceramic body includes the internal electrodes, the connecting electrode, and a piezoelectric ceramic arranged to define a single, unitary body.

4. The piezoelectric device according to claim 1, wherein the piezoelectric body has a plurality of connecting internal electrodes which are provided at respective vertical positions which are substantially the same as positions of the first internal electrodes or the second internal electrodes.

5. The piezoelectric device according to claim 1, wherein the first internal electrodes are exposed only at the first side surface of the piezoelectric body.

6. The piezoelectric device according to claim 1, wherein the second internal electrodes are exposed only at the second side surface of the piezoelectric body.

7. The piezoelectric device according to claim 1, wherein one of the first internal electrodes and the connecting internal electrode are disposed on the same piezoelectric layer.

8. The piezoelectric device according to claim 1, wherein one of the second internal electrodes and the connecting internal electrode are disposed on the same piezoelectric layer.

9. The piezoelectric device according to claim 1, wherein the connecting internal electrode is exposed at the first and second side surfaces of the piezoelectric body.

10. The piezoelectric device according to claim 1, wherein the third external electrode is disposed to completely cover the second side surface of the piezoelectric body.

11. The piezoelectric device according to claim 1, wherein the piezoelectric body, the plurality of internal electrodes, the plurality of piezoelectric layers, the connecting internal electrode, the first, second and third external electrodes are arranged such that electrical connection to an external power surface is achieved only at the first side surface of the piezoelectric body.

12. A piezoelectric actuator comprising:
    a piezoelectric body having an upper surface, a lower surface, and first and second side surfaces opposite each other and disposed between the upper and lower surfaces;
    a plurality of internal electrodes layered in a thickness direction within the piezoelectric body;
    a plurality of piezoelectric layers interposed between the plurality of internal electrodes, the plurality of internal electrodes including first internal electrodes which extend to the first side surface but do not extend to the second side surface, and second internal electrodes which extend to the second side surface but do not extend to the first side surface;
    a connecting internal electrode disposed within the piezoelectric body and extending to the first and second side surfaces;
    a plurality of slits disposed in the upper surface of the piezoelectric body such that the slits extend from the first side surface to the second side surface and are deep enough to penetrate a portion where the plurality of internal electrodes are layered, to thereby define a plurality of piezoelectric actuator units isolated by the slits;
    a plurality of first external electrodes each disposed on the first side surface to correspond to a respective one of the piezoelectric actuator units and electrically connected to the first internal electrodes of the respective piezoelectric actuator unit;

a second external electrode disposed on the first side surface and electrically connected to the connecting internal electrode; and a third external electrode disposed on the second side surface so as to electrically connect the connecting internal electrode and the second internal electrodes of the piezoelectric actuator units.

13. The piezoelectric actuator according to claim 12, wherein the third external electrode extends to a lower region below bottom ends of the slits and has a continuous portion in the lower region.

14. The piezoelectric actuator according to claim 13, wherein the first external electrode is disposed at a position higher than the bottom ends of the slits.

15. The piezoelectric actuator according to claim 1, wherein the piezoelectric body including the plurality of internal electrodes and the connecting internal electrode is a monolithic sintered ceramic body.

16. The piezoelectric actuator according to claim 15, wherein the monolithic sintered ceramic body includes the internal electrodes, the connecting electrode, and a piezoelectric ceramic arranged to define a single, unitary body.

17. The piezoelectric actuator according to claim 12, wherein one of the first internal electrodes and the connecting internal electrode are disposed on the same piezoelectric layer.

18. The piezoelectric actuator according to claim 12, wherein one of the second internal electrodes and the connecting internal electrode are disposed on the same piezoelectric layer.

19. The piezoelectric actuator according to claim 12, wherein the connecting internal electrode is exposed at the first and second side surfaces of the piezoelectric body.

20. The piezoelectric actuator according to claim 12, wherein the piezoelectric body, the plurality of internal electrodes, the plurality of piezoelectric layers, the connecting internal electrode, the first, second and third external electrodes are arranged such that electrical connection to an external power surface is achieved only at the first side surface of the piezoelectric body.

* * * * *